US008688288B2

(12) United States Patent
Shah et al.

(10) Patent No.: US 8,688,288 B2
(45) Date of Patent: Apr. 1, 2014

(54) MANAGING AN INFRASTRUCTURE HOUSING DISAGGREGATED HEAT SOURCES

(75) Inventors: Amip J. Shah, Santa Clara, CA (US);
Cullen E. Bash, Los Gatos, CA (US);
Chih C. Shih, San Jose, CA (US);
Jichuan Chang, Sunnyvale, CA (US);
Parthasarathy Ranganathan, San Jose, CA (US); Justin James Meza, Los Angeles, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 538 days.

(21) Appl. No.: 13/022,260

(22) Filed: Feb. 7, 2011

(65) Prior Publication Data

US 2012/0203381 A1    Aug. 9, 2012

(51) Int. Cl.
*G06F 19/00* (2011.01)
(52) U.S. Cl.
USPC .......................................... 700/299; 700/276
(58) Field of Classification Search
USPC .................. 700/300, 299, 276, 277, 291, 295;
713/320, 300
See application file for complete search history.

(56) References Cited

U.S. PATENT DOCUMENTS

| | | | | |
|---|---|---|---|---|
| 6,374,627 B1* | 4/2002 | Schumacher et al. | ....... | 62/259.2 |
| 7,373,268 B1* | 5/2008 | Viredaz et al. | ................ | 702/130 |
| 7,832,925 B2* | 11/2010 | Archibald et al. | ............. | 374/29 |
| 7,854,652 B2* | 12/2010 | Yates et al. | ..................... | 454/184 |
| 7,979,250 B2* | 7/2011 | Archibald et al. | ................ | 703/5 |
| 2008/0303671 A1* | 12/2008 | Dinh et al. | ................. | 340/572.3 |
| 2009/0150129 A1* | 6/2009 | Archibald et al. | ................ | 703/5 |
| 2010/0134977 A1* | 6/2010 | Chang et al. | .................. | 361/695 |

OTHER PUBLICATIONS

Swoyer, Stephen, "VMware, Cisco, NetApp Team Up for Cloud Security", <http://esj.com/articles/2010/02/03/vmware-cisco-netapp.aspx>, Publication Date: Feb. 3, 2010.
Nathuji, Ripal, Canturk ISCI, and Eugene Gorbatov, "Exploiting Platform Heterogeneity for Power Efficient Data Centers", <http://users.ece.gatech.edu/~rnathuji/files/icac07-heterogeneity.pdf>; Jun. 11-15.
"Data Center Equipment Cooling Configurations", <http://www.lytron.com/tools-technical/notes/data-center-cooling.aspx>.;   Jul. 22, 2010.
"The Efficient, Green Data Center", <http://www.emc.com/collateral/emc-perspective/h5843-green-data-ctr-ep.pdf>, Publication Date: Oct. 2008.

* cited by examiner

*Primary Examiner* — Kidest Bahta

(57) ABSTRACT

In a method for managing an infrastructure housing a plurality of disaggregated heat sources, in which a first disaggregated heat source has different heat dissipation characteristics as compared with a second disaggregated heat source, cooling requirements for the disaggregated heat sources are determined, in which the first disaggregated heat source and the second disaggregated heat source are to be positioned in separate homogeneous zones of the infrastructure. In addition, a respective available cooling resource is associated with the disaggregated heat sources based upon the determined cooling requirements of the disaggregated heat sources.

20 Claims, 7 Drawing Sheets

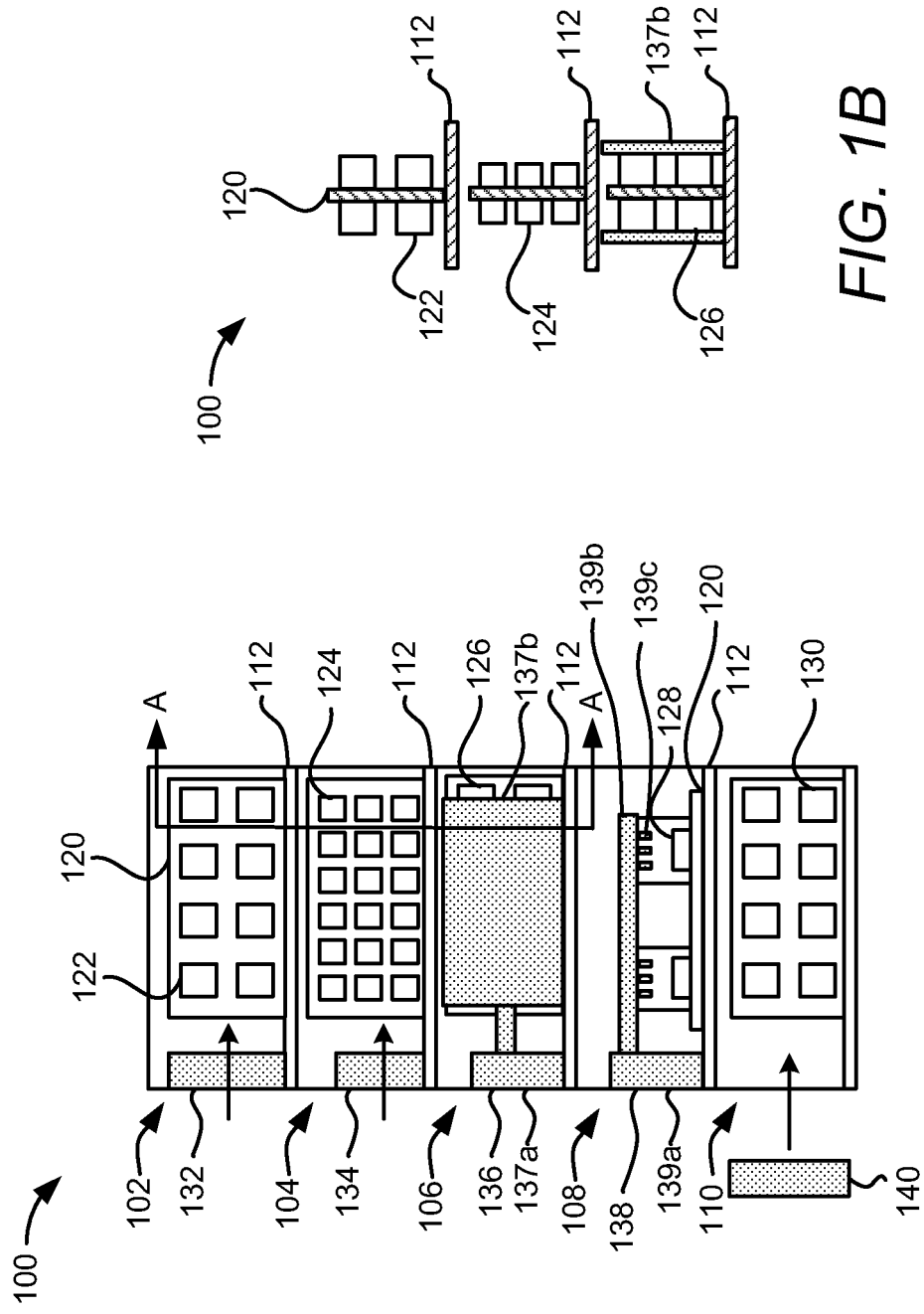

300

DETERMINE COOLING REQUIREMENTS FOR
DISAGGREGATED HEAT SOURCES
302

ASSOCIATE AVAILABLE COOLING RESOURCES WITH
DISAGGREGATED HEAT SOURCES
304

320

```
┌─────────────────────────────────────────────┐
│ DETERMINE ZONES IN AN INFRASTRUCTURE TO HOUSE│
│ RESPECTIVE SETS OF DISAGGREGATED HEAT SOURCES│
│                    322                       │
└─────────────────────────────────────────────┘
                      ↓
┌─────────────────────────────────────────────┐
│      DETERMINE COOLING REQUIREMENTS FOR      │
│        DISAGGREGATED HEAT SOURCES            │
│                    324                       │
└─────────────────────────────────────────────┘
                      ↓
┌─────────────────────────────────────────────┐
│    IDENTIFY A PLURALITY OF COOLING RESOURCES │
│    AVAILABLE FOR USE IN COOLING THE HOMOGENEOUS│
│                    ZONES                     │
│                    326                       │
└─────────────────────────────────────────────┘
                      ↓
┌─────────────────────────────────────────────┐
│    DETERMINE COOLING CAPACITIES OF THE COOLING│
│                  RESOURCES                   │
│                    328                       │
└─────────────────────────────────────────────┘
                      ↓
┌─────────────────────────────────────────────┐
│   ASSOCIATE AVAILABLE COOLING RESOURCES WITH │
│         DISAGGREGATED HEAT SOURCES           │
│                    330                       │
└─────────────────────────────────────────────┘
                      ↓
┌─────────────────────────────────────────────┐
│    ARRANGE THE COOLING RESOURCES AND/OR      │
│         DISAGGREGATED HEAT SOURCES           │
│                    332                       │
└─────────────────────────────────────────────┘
                      ↓
┌─────────────────────────────────────────────┐
│          MANAGE THE INFRASTRUCTURE           │
│                    334                       │
└─────────────────────────────────────────────┘
```

*FIG. 3B*

MANAGING AN INFRASTRUCTURE HOUSING DISAGGREGATED HEAT SOURCES

BACKGROUND

Information technology (IT) systems have traditionally been built based on stand-alone architectures. These traditional IT systems are intended to support a wide variety of workloads and hence each IT system contains operating components such as processors, memory, fans, input/output (I/O), etc. In large computing environments, this often leads to unnecessary redundancy and low utilization rates, since not every type of workload requires each component to be operating at maximum capacity. Component utilization levels as low as 20% are common in several enterprise data centers. Such architectures in turn generally require the provision of uniform cooling capacity across the entire data center. This leads to higher acquisition and operating costs as well as unnecessary wastage as the entire system reaches end-of-life whenever any of these components need to be upgraded.

From a cooling perspective, the primary components of the traditional IT system that require cooling are a microprocessor, a hard disk, memory, I/O and, in some instances, a power supply. However, these components have different cooling characteristics. The different cooling characteristics may be caused by the different geometric shapes, different power dissipation rates, and different power densities of each component. Because of the different cooling characteristics the components are amenable to different cooling systems. For example, components such as hard disk drives and memory require substantially less cooling as compared to other components, such as microprocessors.

BRIEF DESCRIPTION OF THE DRAWINGS

Features of the present disclosure will become apparent to those skilled in the art from the following description with reference to the figures, in which:

FIG. 1A shows a simplified cross-sectional side view of an infrastructure housing a plurality of disaggregated heat sources arranged in a plurality of homogeneous zones, according to an example of the present disclosure;

FIG. 1B shows a cross-sectional side view taken along line "A-A" in FIG. 1A, according to an example of the present disclosure;

FIGS. 3A and 3B, respectively, show flow diagrams of methods for managing an infrastructure, such as, the infrastructure depicted in FIG. 1A, according to an example of the present disclosure.

DETAILED DESCRIPTION

Figure 1C:
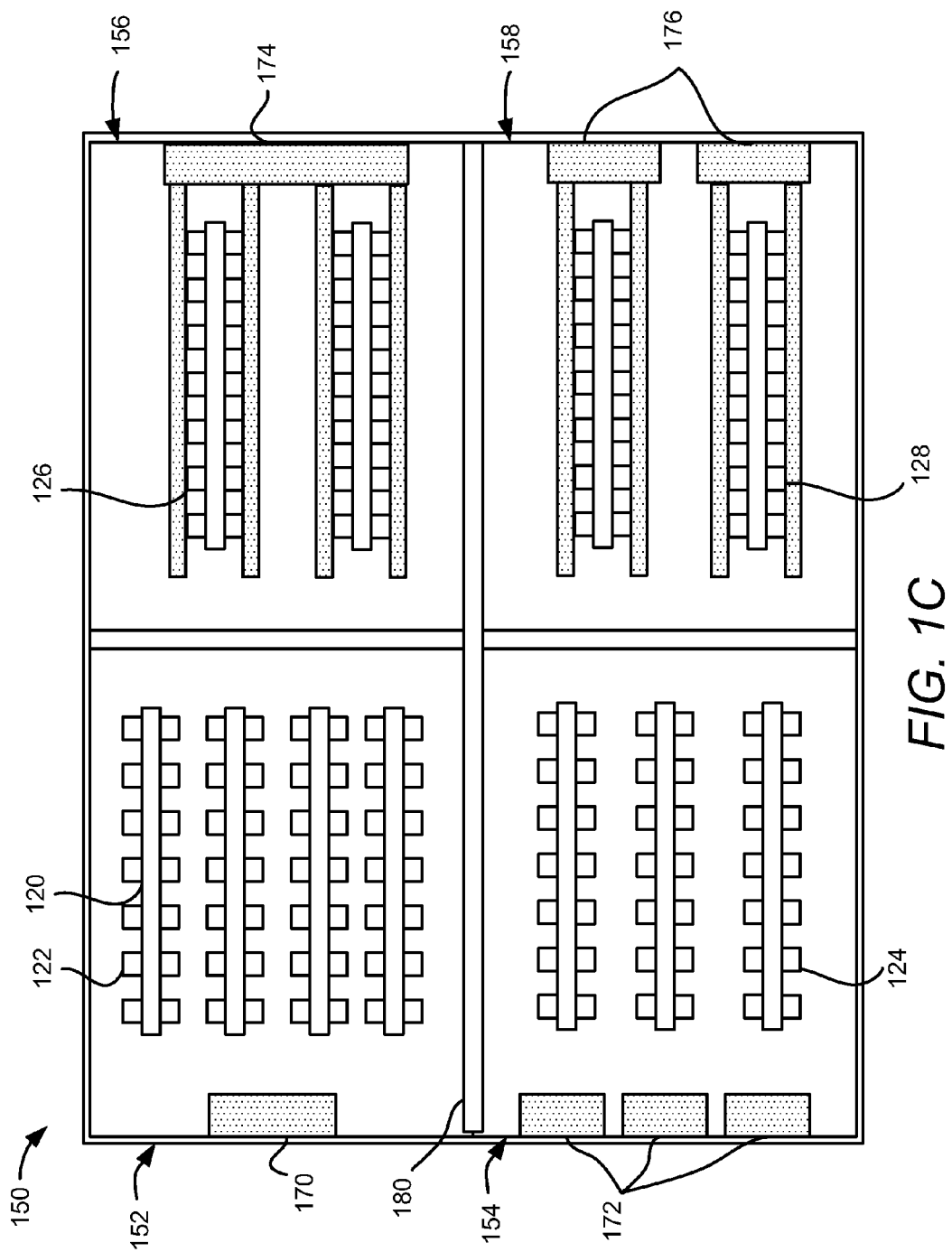
FIG. 1C shows a simplified schematic top view diagram of an infrastructure housing a plurality of disaggregated heat sources arranged in a plurality of homogeneous zones, according to another example of the present disclosure.

For simplicity and illustrative purposes, the present disclosure is described by referring mainly to examples thereof. In the following description, numerous specific details are set forth in order to provide a thorough understanding of the present disclosure. It will be readily apparent however, that the present disclosure may be practiced without limitation to these specific details. In other instances, some methods and structures are not described in detail so as not to unnecessarily obscure the description of the present disclosure. As used herein, the term "includes" means includes but not limited to, the term "including" means including but not limited to. The term "based on" means based at least in part on.

Disclosed herein are an apparatus and a method for managing an infrastructure housing a plurality of disaggregated heat sources, in which a first disaggregated heat source has different heat dissipation characteristics as compared with a second disaggregated heat source. The method and apparatus may be used to disaggregate system architectures into discrete, function-specific zones, such as, but not limited to electronics cabinets, shelves on electronics cabinets, etc. Heterogeneous cooling resources that may be deployed in support of the function-specific zones are also disclosed. Through implementation of the apparatus and method disclosed herein, cooling resources and disaggregated heat sources may be associated with each other to substantially improve utilization, lower energy costs, and reduce environmental footprint of the infrastructure. Thus, in one example, the disaggregated heat sources may be positioned in homogeneous zones and heterogeneous cooling resources may be associated with the disaggregated heat sources in the zones. In another example, the cooling resources may be positioned in the homogeneous zones and the disaggregated heat sources may be associated with the cooling resources.

With reference first to FIG. 1A, there is shown a simplified cross-sectional side view of an infrastructure 100 housing a plurality of disaggregated heat sources arranged in a plurality of homogeneous zones, according to an example. It should be understood that the infrastructure 100 may include additional elements and that some of the elements described herein may be removed and/or modified without departing from a scope of the infrastructure 100.

The infrastructure 100 may comprise any of a number of different types of structures, such as, for instance, a building, a data center, an electronics rack, a computing device, etc. As shown in FIG. 1A, the infrastructure 100 is depicted as an electronics rack composed of a plurality of zones 102-110. Each of the zones 102-110 comprises a separate zone that may be substantially thermally isolated from each other. As such, for instance, heat dissipated by the heat sources in one zone 102 may not substantially affect the temperatures in any of the other zones 104-110. In this regard, and according to an example, thermally insulative dividers 112 may be positioned between adjacent zones 102-110.

Each of the zones 102-110 is also depicted as including respective sets of disaggregated heat sources 122-130. The zones 102-110 are considered to be homogeneous because, in one example, each of the zones 102-110 houses a set of disaggregated heat sources 122-130 that are homogeneous with respect to each other. That is, the disaggregated heat sources 122 housed in a first zone 102 are homogeneous with respect to each other, the disaggregated heat sources 124 housed in a second zone 104 are homogeneous with respect to each other, etc. By way of example, a disaggregated heat source is considered as being homogeneous with another disaggregated heat source if both of the disaggregated heat sources perform substantially the same functions and/or dissipate substantially the same amounts of heat. In another example, a particular zone 102 may house heterogeneous disaggregated heat sources 122-130, but the heterogeneous disaggregated heat sources 122-130 may be operated to have the same or similar heat dissipation levels or characteristics and thus, the disaggregated heat sources 122-130 may also be construed as being homogeneous with respect to each other in this example.

A disaggregated heat source 122-130 generally comprises an electronic component that performs a particular function, such as, data storage, data processing, video data processing, audio data processing, etc. Examples of suitable disaggregated heat sources 122-130 include, for instance, processors, microprocessors, memory controllers, data stores, graphics cards, sound cards, etc. Generally speaking, therefore, the disaggregated heat sources 122-130 comprise various components of electronic devices without the casing surrounding the various components. In addition, the sets of disaggregated heat sources 122-130 are arranged into the homogeneous zones according to the functions that the disaggregated heat sources 122-130 perform. Thus, for instance, each of the disaggregated heat sources 122 positioned in a first homogeneous zone 102 may comprise processors, whereas each of the disaggregated heat sources 124 positioned in the second homogeneous zone 104 may comprise memory controllers. As such, disaggregated heat sources 122-130 may be grouped according to their common functionalities.

According to another example, the disaggregated heat sources 122-130 may be grouped according to their heat dissipation characteristics. Thus, for instance, each of the disaggregated heat sources 122 positioned in the first homogeneous zone 102 may dissipate similar levels of heat with respect to each other, while each of the disaggregated heat sources 124 positioned in the second homogeneous zone 104 may dissipate similar levels of heat with respect to each other. Likewise, each of the sets of disaggregated heat sources 126-130 in the remaining zones 106-110 may have respectively similar heat dissipation characteristics.

According to an example, each of the sets of disaggregated heat sources 122-130 is attached to a respective board 120. The boards 120 may comprise circuit boards through which the disaggregated heat sources 122-130 may receive power and communicate data signals. The disaggregated heat sources 122-130 may be attached to the respective boards 120 in any reasonably suitable manner, including, through soldering, mated connections, etc. In addition, as shown in FIG. 1B, which shows a cross-sectional side view taken along line "A-A" in FIG. 1A, the disaggregated heat sources 122-126 may be positioned on both sides of the boards 120. Furthermore, the disaggregated heat sources 122-130 may be variously positioned on the boards 120 to substantially maximize the dissipation of the heat generated by the disaggregated heat sources 122-130. By way of example, some of the disaggregated heat sources 122-130 may be positioned such that they are not directly in the path of airflow heated by a disaggregated heat source 122-130 positioned upstream of those disaggregated heat sources 122-130.

As also shown in FIG. 1A, each of the zones 102-110 includes a respective cooling resource 132-140 positioned to cool the respective sets of disaggregated heat sources 122-130, although multiple cooling resources may be positioned to a single set of disaggregated heat sources 122-130 in a particular zone 102-110. The cooling resources 132-140 may comprise any of a number of different types of available cooling resources. For instance, the cooling resources 132-140 may comprise fans, blowers, air conditioning units, refrigeration systems, thermoelectric cooling systems, inkjet-type spray cooling resources, etc. In addition, the cooling resources 132-140 may comprise the same types of cooling resources, such as, fans, having different cooling capacities. Furthermore, the cooling resources 132-140 may be connected to other cooling resources (not shown) with which the cooling resources 132-140 may receive cooling fluid, such as, chilled water, refrigerant, etc. In this example, the other cooling resources may comprise various components, such as, condensers, heat exchangers, etc., configured to cool the cooling fluid prior to delivery to the cooling resources 132-140.

As shown in FIG. 1A, a first fan 132 is positioned to cool the disaggregated heat sources 122 housed in the first homogeneous zone 102 and a second fan 134 is positioned to cool the disaggregated heat sources 124 housed in the second homogeneous zone 104. A liquid cooling resource 136 is positioned to cool the disaggregated heat sources 126 housed in the third homogeneous zone 106. The liquid cooling resource 136 generally includes a cooling section 137a and a cold plate 137b through which coolant, such as water or refrigerant flows. As shown in FIG. 1B, the cold plate 137b is in thermal contact with the disaggregated heat sources 126 to directly absorb heat dissipated by the disaggregated heat sources 126 to thereby cool those heat sources 126.

A different type of liquid cooling resource 138 is positioned to cool the disaggregated heat sources 128 housed in the fourth homogeneous zone 108. The liquid cooling resource 138 includes a cooling section 139a, a coolant delivery section 139b, and a plurality of nozzles 139c. In operation, the nozzles 139c may be operated to controllably deliver coolant to particular areas of the disaggregated heat sources 128. The controlled delivery may also include the amount of coolant delivered to the particular areas of the disaggregated heat sources 128.

The fifth homogeneous zone 110 is depicted as being cooled by an external fan 140. The external fan 140 may comprise, for instance, a room level air conditioning unit. In this regard, the fifth homogeneous zone 110 may comprise disaggregated heat sources 128 that do not dissipate relatively large amounts of heat and may thus be sufficiently cooled by the cooling airflow generated by the room level air conditioning unit.

As discussed in greater detail herein below, the particular cooling resource provided in each of the homogeneous zones 102-110 may substantially be based upon the level of heat dissipated by and therefore the cooling requirements of the disaggregated heat sources 122-130 housed in the respective homogeneous zones 102-110.

Turning now to FIG. 1C, there is shown a simplified schematic top view diagram of an infrastructure 150, in this instance, a data center, or other such building or structure, housing a plurality of disaggregated heat sources arranged in a plurality of homogeneous zones, according to another example. It should be understood that the infrastructure 100 may include additional elements and that some of the elements described herein may be removed and/or modified without departing from a scope of the infrastructure 100.

As shown in FIG. 1C, the infrastructure 150 includes a plurality of homogeneous zones 152-158. Each of the zones 152-158 comprises a separate area that may be substantially thermally isolated from each other. As such, for instance, heat dissipated by the heat sources in one zone 152 does not substantially affect the temperatures in any of the other zones 154-158. In this regard, and according to an example, thermally insulative dividers 180 may be positioned between adjacent zones 152-158.

Each of the homogeneous zones 152-158 is also depicted as housing respective sets of disaggregated heat sources 122- 128, in which the disaggregated heat sources 122-128 are arranged on boards 120 or spines. The boards 120 may comprise free-standing or supported structures to which the disaggregated heat sources 122-128 are attached. The boards 120 may also comprise relatively tall structures, for instance, extending from the floor to the ceiling of a data center, or may comprise relatively shorter structures, for instance, that are connected to each other to achieve desired heights. In addition, the boards 120 may comprise various elements for supplying power and data communications to and from the disaggregated heat sources 122-128. Although not explicitly shown in FIG. 1C, a plurality of disaggregated heat sources 122-128 may be arranged along the heights of the boards 120. In addition, or alternatively, the disaggregated heat sources 122-128 may be arranged in various configurations to substantially maximize airflow through and over the disaggregated heat sources 122-128.

As discussed with respect to the infrastructure 100, the zones 152-158 of the infrastructure 150 also house respective sets of homogeneous disaggregated heat sources 122-128. More particularly, for instance, the first zone 152 houses a set or sets of disaggregated heat sources 122 that are homogeneous with respect to each other, the second zone 154 houses a set or sets of disaggregated heat sources 124 that are homogeneous with respect to each other, etc.

As also shown in FIG. 1C, each of the zones 152-158 includes a respective cooling resource 170-176 positioned to cool the sets of disaggregated heat sources 122-128 housed in each of the respective homogeneous zones 152-158. The cooling resources 170-176 may comprise the cooling resources 132-140 discussed above with respect to FIG. 1A. As also discussed in greater detail herein below, the cooling resources 170-176 may be selected substantially based upon the level of heat dissipated by and therefore the cooling requirements of the disaggregated heat sources 122-130 housed in the respective homogeneous zones 152-158.

According to an example, the disaggregated heat sources 122-130 depicted in FIGS. 1A-1C may be separated into the homogeneous zones 102-110, 152-158 based upon terms set forth in a service level agreement (SLA). In this example, a particular disaggregated heat source 122/cooling resource 132/170 combination may be selected based upon the level of service to be delivered and the amount of cost to be charged to a client as set forth in the SLA. In addition, another disaggregated heat source 122/cooling resource 134/172 combination may be selected based upon the level of service to be delivered and the amount of cost to be charged to another client as set forth in another SLA. As a further example, the SLAs may be based upon which of the variously configured disaggregated heat source 122-130/cooling resource 132-140/170- 178 combinations are to be utilized for the SLA client.

Figure 2A:
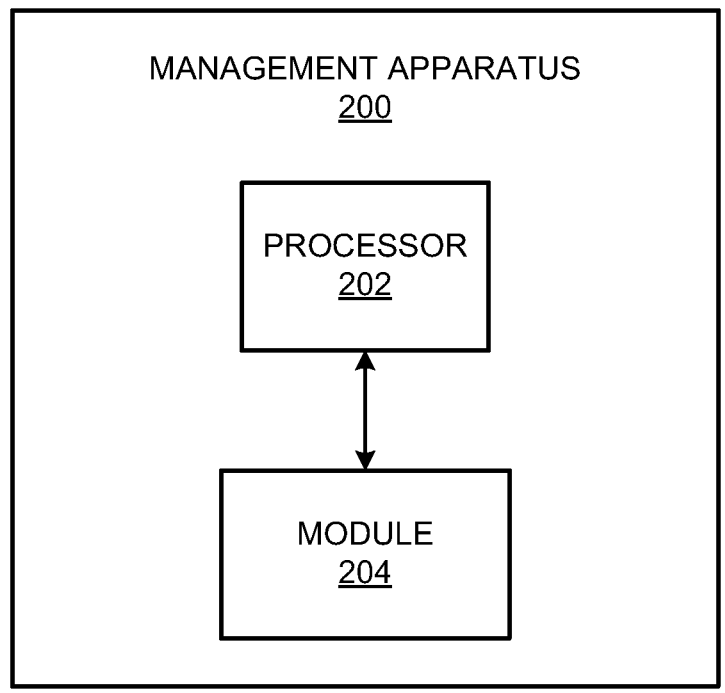
FIG. 2A shows a block diagram of a management apparatus for managing an infrastructure having a plurality of disaggregated heat sources, according to an example of the present disclosure.

Turning now to FIG. 2A, there is shown a block diagram of a management apparatus 200 for managing an infrastructure housing a plurality of disaggregated heat sources, according to an example. It should be understood that the apparatus 200 may include additional components and that one or more of the components described herein may be removed and/or modified without departing from a scope of the apparatus 200. Although particular reference is made to the elements depicted in the infrastructure 100 of FIG. 1A in the description of the management apparatus 200, it should be understood that the management apparatus 200 may be implemented in other variously configured infrastructures, such as, but not limited to the infrastructure 150 depicted in FIG. 1C, etc.

As shown in FIG. 2A, the management apparatus 200 includes a processor 202 and a module 204. The module 204 is to determine cooling requirements for the disaggregated heat sources 122-130, in which a first disaggregated heat source 122 and a second disaggregated heat source 124 are to be positioned in separate homogeneous zones of the infrastructure 100, to associate a respective available cooling resource 132-140 with the disaggregated heat sources 122- 130 based upon the determined cooling requirements of the disaggregated heat sources 122-130. In addition, the processor 202 is to implement the module 204.

Figure 2B:
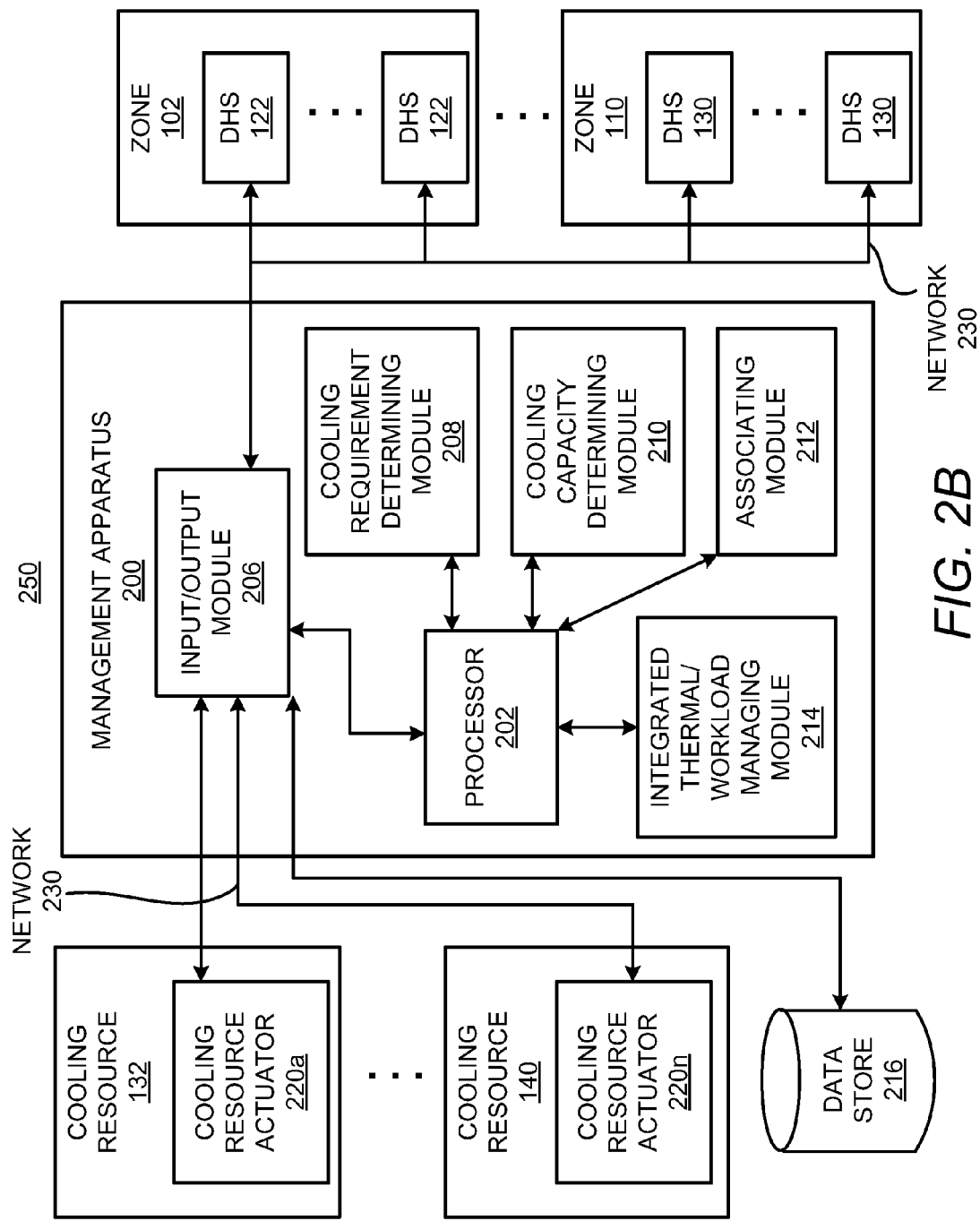
FIG. 2B shows a block diagram of a system for managing an infrastructure having a plurality of disaggregated heat sources arranged in a plurality of homogeneous zones, according to an example of the present disclosure.

Turning now to FIG. 2B, there is shown a block diagram of a system 250 for managing an infrastructure having a plurality of disaggregated heat sources arranged in a plurality of homogeneous zones, according to an example. It should be understood that the system 250 may include additional components and that one or more of the components described herein may be removed and/or modified without departing from a scope of the system 250. Although particular reference is made to the elements depicted in the infrastructure 100 of FIG. 1A in the description of the system 250, it should be understood that the system 250 may be implemented in other variously configured infrastructures, such as, but not limited to the infrastructure 150 depicted in FIG. 1C, etc.

Generally speaking, the system 250 comprises a management apparatus, such as the management apparatus 200 depicted in FIG. 2A, which is configured to perform various functions in the system 250. In one regard, the management apparatus 200 is to determine which ones of available cooling resources 132-140 are to be associated with which ones of the homogeneous zones 102-110. In this regard, the management apparatus 200 may be implemented as a tool for designing the infrastructure 100. In another regard, the management apparatus 200 is to manage the infrastructure 100 by controlling operation of the cooling resources 132-140. In this regard, the management apparatus 200 may be implemented as a tool for operating the infrastructure 100.

Similarly to FIG. 2A, the management apparatus 200 is depicted as including a processor 202. However, the management apparatus 200 is depicted as including a plurality of modules 206-214 instead of the single module 204 depicted in FIG. 2A. More particularly, in FIG. 2B, the management apparatus 200 is depicted as including an input/output module 206, a cooling requirement determining module 208, a cooling capacity determining module 210, an associating module 212, and an integrated thermal/workload managing module 214. In one example, the management apparatus 200 comprises a computing device, such as, a computer, server, laptop, etc. In this example, the modules 206-214 comprise hardware devices, such as circuits or chips. In another example, the management apparatus 200 comprises a computer readable storage medium containing machine readable instructions, that when implemented, performs various operations with respect to the cooling resources 132-140 and the disaggregated heat sources 122-130. In this example, the modules 206-214 comprise machine readable instructions. In a further example, the modules 206-214 comprise a combination of hardware devices and machine readable instructions.

The management apparatus 200 is also depicted as being interfaced with a data store 216, which may comprise any reasonably suitable memory upon which the management apparatus 200 may store data and from which the management apparatus 200 may retrieve data. Although the data store 216 has been depicted as forming a separate component from the management apparatus 200, it should be understood that the data store 216 may be integrated with the management apparatus 200 without departing from a scope of the system 250.

The system 250 is also depicted as including a plurality of homogeneous zones 102-110 and cooling resources 132-140. Although the same number of zones 102-110 and cooling resources 132-140 depicted in FIG. 1A have been depicted in FIG. 2, it should clearly be understood that the system 250 may include any number of zones 102-110 and cooling resources 132-140. The homogeneous zones 102-110 have been depicted as each including a respective set of disaggregated heat sources (DHSs) 122-130. In addition, the cooling resources 132-140 have been depicted as each including a respective cooling resource actuator 220a-220n. The management apparatus 200 may communicate with the DHSs 122-130 and the cooling resources 132-140 through a network 230, which may comprise a wired or wireless network.

The cooling resource actuators 220a-220n are generally operable to vary the amount of cooling resources being delivered to the DHSs 122-130 in their respective zones 102-110. By way of example, in which a cooling resource 132 comprises a fan, the cooling resource actuator 220a may comprise a motor that may be variably operated to vary the amount of airflow supplied by the cooling resource 132. As another example in which a cooling resource 134 comprises a cooling liquid supplying device, the cooling resource actuator 220b may comprise a pump or valve that may be variably operated to vary the amount of cooling liquid supplied to the DHSs 124 located in a particular zone 104.

Figure 3A:

Various manners in which the system 250 may be operated are described in greater detail with respect to FIGS. 3A and 3B. FIGS. 3A and 3B, respectively depict flow diagrams of methods 300 and 320 for managing an infrastructure, such as the infrastructure 100 depicted in FIG. 1A, according to two examples. It should be understood that the methods 300 and 320 may include additional processes and that one or more of the processes described herein may be removed and/or modified without departing from the scopes of the methods 300 and 320.

The descriptions of the methods 300 and 320 are made with reference to the infrastructure 100 and the system 250 respectively depicted in FIGS. 1A and 2B and thus make particular reference to the elements contained therein. It should, however, be understood that the methods 300 and 320 may be implemented by an infrastructure and system that differ from the infrastructure 100 and system 250 without departing from the scopes of the methods 300 and 320. In addition, the method 320 depicted in FIG. 3B contains a more detailed description of the processes that the management apparatus 200 may implement as compared with the method 300.

With reference first to the method 300 in FIG. 3A, at block 302, cooling requirements for the disaggregated heat sources 122-130 are determined, for instance, by the cooling requirement determining module 208. The cooling requirement determining module 208 may determine the cooling requirements for the disaggregated heat sources 122-130 based upon heat dissipation characteristics of the disaggregated heat sources 122-130. The heat dissipation characteristics of the disaggregated heat sources 122-130 may be determined from heat dissipation characteristics identified by the disaggregated heat source 122-130 manufacturers or through testing of the disaggregated heat sources 122-130. By way of particular example, the cooling requirement determining module 208 may determine the amount of heat estimated to be generated by each of the disaggregated heat sources 122-130 during normal and/or peak operations thereof and may aggregate those heat amounts to determine the total amount of heat estimated or likely to be dissipated by the respective sets of disaggregated heat sources 122-130 in each of the homogeneous zones 102-110.

At block 304, the available cooling resources 132-140 are associated with the disaggregated heat sources 122-130 based upon the cooling requirements of the disaggregated heat sources 122-130, for instance, by the associating module 212. More particularly, the associating module 212 may determine which of the available cooling resources 132-140 is able to meet the cooling requirements of respective sets of disaggregated heat sources 122-130. Thus, for instance, the associating module 210 may determine that a fan may be unable to provide sufficient cooling to a set of processors and may thus associate the processors with a liquid coolant type cooling resource. In addition, of the available cooling resources 132-140 that are able to meet the cooling requirements, the associating module 210 may determine which of the available cooling resources 132-140 satisfies a predetermined objective, as discussed in greater detail herein below with respect to the method 350 in FIG. 3B.

Turning now to FIG. 3B, at block 322, zones 102-110 in an infrastructure 100 to house respective sets of disaggregated heat sources 122-130 are determined. By way of example, the zones 102-110 may be determined based upon the types of disaggregated heat sources 122-130 to be arranged on separate boards 120 or spines based upon their respective functionalities. For instance, those disaggregated heat sources 122 that share the same functionalities may be arranged on a common board 120. As such, for instance, the disaggregated heat sources 122-130 that perform data processing functions may be positioned on the same board 120. As another example, the disaggregated heat sources 122-130 that share a common characteristic, such as, heat dissipation characteristics, may be positioned on the same board 120.

In addition, or alternatively, the zones 102-110 may be determined based upon the cooling provided by each of the cooling resources 132-140. In this example, a first zone 102 may be defined as a zone that is cooled by a first cooling resource 132, a second zone 104 may be defined as a zone that is cooled by a second cooling resource 134, etc.

The arrangements of the disaggregated heat sources 122-130 on the boards 120 and/or the cooling resources 132-140 may be virtual or actual. As such, for instance, multiple possible configurations for the disaggregated heat sources 122-130 and/or the cooling resources 132-140 in the zones 102-110 may be identified and stored in the data store 216. Alternatively, the disaggregated heat sources 122-130 may physically be arranged on the boards 120 in the respective zones 102-110.

According to an example, in addition and/or alternatively to arranging the disaggregated heat sources 122-130 based upon their respective functionalities at block 302, the disaggregated heat sources 122-130 may be managed (block 310) to dissipate certain levels of heat based upon the zones 102-110 in which the disaggregated heat sources 122-130 are placed. Thus, for instance, if a processor is placed in the same zone 102 as a plurality of graphics controllers, the processor may be throttled to have the same or similar heat dissipation characteristics as the graphics controllers.

At block 324, cooling requirements for the disaggregated heat sources 122-130 are determined in various manners as discussed above with respect to block 302 in FIG. 3A.

At block 326, a plurality of cooling resources 132-140 available for use in cooling the homogeneous zones 102-110 may be identified, for instance, by the cooling capacity determining module 210. In one example, the locations of the plurality of cooling resources 132-140 in the infrastructure 100 may be identified. By way of example, information pertaining to the cooling resources 132-140 available for use, and in certain instances, their locations, in the infrastructure 100 may be stored in the data store 214 and the cooling capacity determining module 210 may access the data store 214 to identify the available cooling resources 132-140. As another example, a user may input the available cooling resources 132-140 into the management apparatus 200.

At block 328, cooling capacities of the cooling resources 132-140 are determined, for instance, by the cooling capacity determining module 210. More particularly, for instance, the cooling capacity determining module 210 may determine or identify the cooling abilities of each of the cooling resources 132-140. The cooling capacity determining module 210 may determine the cooling capacities of the cooling resources 132-140 based upon information supplied by the cooling resource 132-140 manufacturers or through testing of the cooling resources 132-140. In addition, the cooling capacity determining module 210 may also identify various other information pertaining to the available cooling resources 132-140, such as, energy consumption characteristics, environmental impact characteristics, etc.

At block 330, the available cooling resources 132-140 are associated with the disaggregated heat sources 122-130 based upon the cooling requirements of the disaggregated heat sources 122-130 and the cooling capacities of the cooling resources 132-140, for instance, by the associating module 212. More particularly, the associating module 212 may determine which of the available cooling resources 132-140 is able to meet the cooling requirements of respective sets of disaggregated heat sources 122-130. Thus, for instance, the associating module 210 may determine that a fan may be unable to provide sufficient cooling to a set of processors and may thus associate the processors with a liquid coolant type cooling resource. In addition, of the available cooling resources 132-140 that are able to meet the cooling requirements, the associating module 210 may determine which of the available cooling resources 132-140 satisfies a predetermined objective.

The predetermined objective may include, for instance, at least one of minimizing energy consumed by the disaggregated heat sources 122-130 in performing workloads, minimizing energy consumed by the cooling resources 132-140 in cooling the disaggregated heat sources 122-130, maximizing performance by the disaggregated heat sources 122-130 in performing the workloads, maximizing performance by the cooling resources 132-140 in cooling the disaggregated heat sources 122-130, minimizing an environmental impact of the infrastructure 100, minimizing a cost of constructing the infrastructure 100 to house the plurality of disaggregated heat sources in the homogeneous zones, minimizing a cost of implementing the cooling resources 132-140, etc. In one regard, the associating module 212 is to substantially optimize performance of the disaggregated heat sources 122-130 and the cooling resources 132-140 through associating of the cooling resources 132-140 with the sets of disaggregated heat sources 122-130 contained in the respective homogeneous zones 102-110.

According to an example, the associating module 212 associates the cooling resources 132-140 to the disaggregated heat sources 122-130 in a hierarchical manner. More particularly, for instance, the associating module 212 associates the disaggregated heat sources 122-130 having the highest expected heat loads with the cooling resource 132-140 having the highest cooling capacity. In addition, the associating module 212 associates the disaggregated heat sources 122-130 having the second highest expected heat load with the cooling resource 132-140 having the second highest cooling capacity, and so forth.

According to another example, the associating module 212 associates a cooling resource 132-140 to multiple zones 102-110. According to a further example, the cooling resource associating module 212 associates a plurality of cooling resources 132-140 to a single zone 102-110.

The associating module 212 may iterate through various combinations of cooling resource 132-140 and disaggregated heat sources 122-130 in associating the available cooling resources 132-140 to the disaggregated heat sources 122-130. More particularly, for instance, the associating module 212 may iterate through various simulations of possible combinations to identify which of the combinations yields desired and/or optimized results. By way of example, the associating module 212 may perform the various simulations to determine which combination yields optimized workload performance with minimized operating costs, which combination yields performance that complies with provisions of various SLAs, etc.

At block 332, the cooling resources 132-140 and the disaggregated heat sources 122-130 may be arranged with respect to each other in the homogeneous zones 102-110 based upon the associations determined at block 310. In one example, the disaggregated heat sources 122-130 may initially be positioned in homogeneous zones 102-110 of the infrastructure 100 and the heterogeneous cooling resources 132-140 may be associated with the disaggregated heat sources 122-130 and arranged in the zones 102-110. In another example, the cooling resources 132-140 may initially be positioned in the homogeneous zones 102-110 of the infrastructure 100 and the disaggregated heat sources 122-130 may be associated with the cooling resources 132-140 in the zones 102-110.

At block 334, the infrastructure 100 is managed, for instance, by the integrated thermal/workload managing module 214. More particularly, for instance, the integrated thermal/workload managing module 214 is to operate the cooling resource actuators 220a-220n of the cooling resources 132-140 to thereby control the level of cooling supplied to the disaggregated heat sources 122-130 in the zones 102-110. In one example, the integrated thermal/workload managing module 214 is to control the cooling resource actuators 220a-220n to ensure that the disaggregated heat sources 122-130 receive sufficient cooling to substantially maintain the disaggregated heat sources 122-130 within predetermined temperature ranges, while substantially minimizing energy usage. Thus, for instance, the integrated thermal/workload managing module 214 may determine the operating levels of the disaggregated heat sources 122-130 in the respective zones and may operate the cooling resources 132-140 to sufficiently cool those disaggregated heat sources 122-130, while substantially minimizing the amount of energy consumed by the cooling resources 132-140. The integrated thermal/workload managing module 214 may determine the operating levels through, for instance, collection of temperature information in or around the disaggregated heat sources 122-130, determination of the workloads placed on the disaggregated heat sources 122-130, etc.

According to a particular example, the integrated thermal/workload managing module 214 may manage the infrastructure 100 by, in response to a determination that a capacity constraint of a cooling resource 132-140 has been violated, associating multiple cooling resources 132-140 to a functional zone in the infrastructure 100 and postponing performance of workloads to be performed by disaggregated heat sources 132-140 that are outside of the functional zone. In other words, the integrated thermal/workload managing module 214 may schedule workloads to be performed by the disaggregated heat sources 132-140 sequentially instead of concurrently.

According to another particular example, the integrated thermal/workload managing module 214 may scale workloads across disaggregated heat sources 122-130 in multiple homogeneous zones 102-110 to substantially prevent heat dissipation by the disaggregated heat sources 122-130 from exceeding available cooling capacities of the respective available cooling resources 132-140. As a further particular example, the integrated thermal/workload managing module 212 may implement an agent-based trading operation among the disaggregated heat sources 122-130 in a plurality of the homogeneous zones 102-110. In this example, each of the disaggregated heat sources 122-130 and each of the cooling resources 132-140 act as agents under an effective trading scheme, such that, the number of resources to be used by each agent is satisfied by another agent. This example may include a preliminary assignment of workloads on each of the agents of the disaggregated heat sources 122-130 and the cooling resources 132-140, arbitrary or numerical shifting of disaggregated heat source 122-130 and/or cooling resource 132-140 loads, and iterative associating verification for the needs of each agent. In addition, numerical difference schemes may be used to substantially ensure convergence under well-posed definitions for each trade that occurs within such a scheme.

The integrated thermal/workload managing module 214 may manage the infrastructure 100 through implementation of additional management operations. For instance, the integrated thermal/workload managing module 214 may implement a method to mitigate failures in the infrastructure 100 by reallocating heat loads and/or cooling resources in the event of a failure of a pre-assigned association. As another example, the integrated thermal/workload managing module 214 may manage the infrastructure by inducing thermal zones through manipulation of cooling resources in order to create high-density and low-density cooling zones and/or distributing the loads across the hardware in a manner that leads to high heat density and low heat density regions.

Some or all of the operations set forth in the figures may be contained as a utility, program, or subprogram, in one or more non-transitory computer readable storage mediums. In addition, the operations may be embodied by machine readable instructions, which may exist in a variety of forms both active and inactive. For example, they may exist as machine readable instructions comprised of program instructions in source code, object code, executable code or other formats. Any of the above may be embodied on a computer readable storage medium, which include storage devices.

Examples of computer readable storage devices include conventional computer system random access memory (RAM), read-only memory (ROM), erasable programmable read-only memory (EPROM), electrically erasable programmable read-only memory (EEPROM), and magnetic or optical disks or tapes. Concrete examples of the foregoing include distribution of the machine-readable instructions on a compact disc read only memory (CD ROM) or via Internet download. It is therefore to be understood that any electronic device capable of executing the above-described functions may perform those functions enumerated above.

Figure 4:
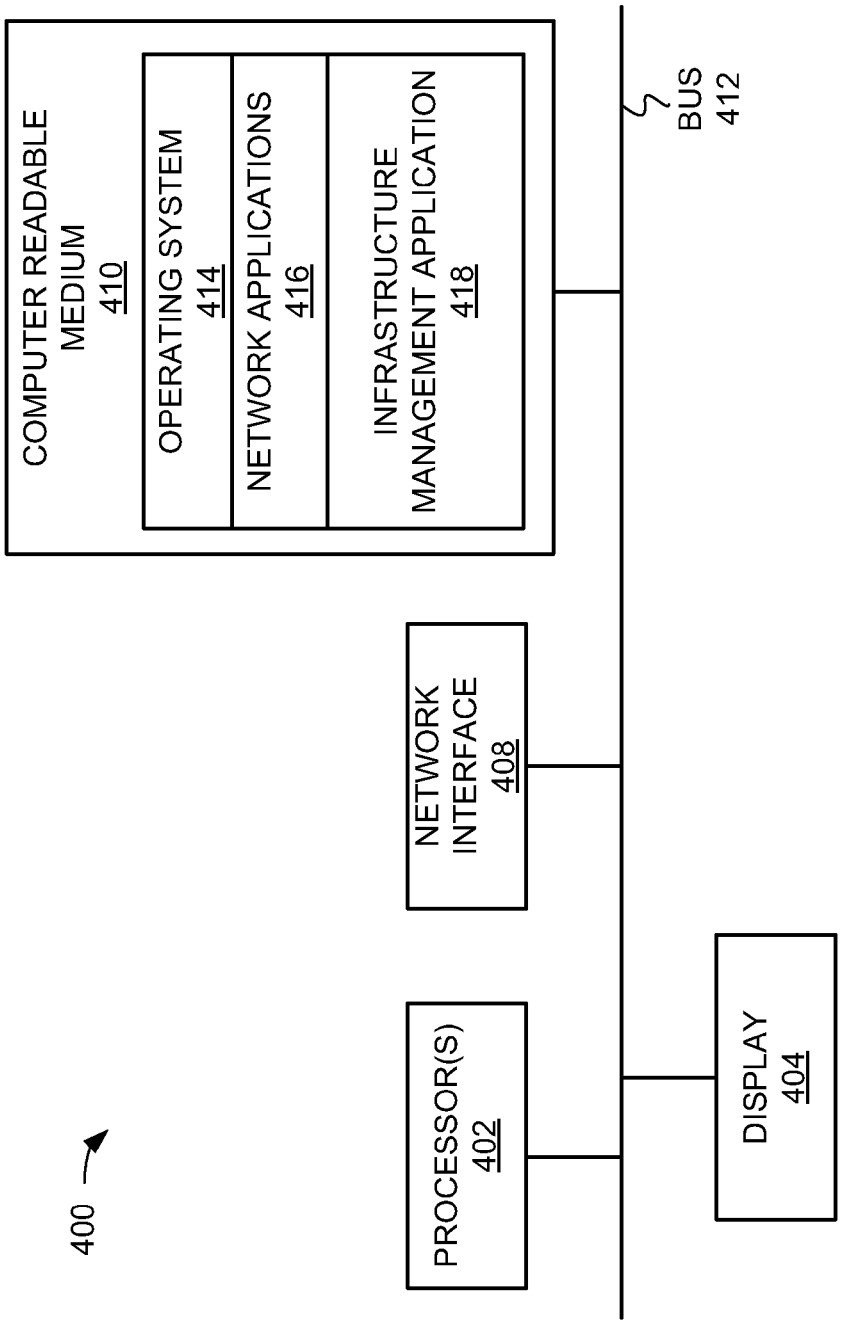
FIG. 4 illustrates a computing device, which may be employed to perform various functions of the management apparatus depicted in FIGS. 2A and 2B, according to an example of the present disclosure.

Turning now to FIG. 4, there is shown a schematic representation of a computing device 400, which may be employed to perform various functions of the management apparatus depicted in FIGS. 2A and 2B, according to an example. The device 400 includes a processor 402, such as a central processing unit; a display device 404, such as a monitor; a network interface 408, such as a Local Area Network LAN, a wireless 802.11x LAN, a 3G mobile WAN or a Wi Max WAN; and a computer-readable medium 410. Each of these components is operatively coupled to a bus 412. For example, the bus 412 may be an EISA, a PCI, a USB, a FireWire, a NuBus, or a PDS.

The computer readable medium 410 may be any suitable medium that participates in providing instructions to the processor 402 for execution. For example, the computer readable medium 410 may be non-volatile media, such as an optical or a magnetic disk; volatile media, such as memory; and transmission media, such as coaxial cables, copper wire, and fiber optics. Transmission media can also take the form of acoustic, light, or radio frequency waves. The computer readable medium 410 may also store other machine readable instructions, including word processors, browsers, email, Instant Messaging, media players, and telephony machine-readable instructions.

The computer-readable medium 410 may also store an operating system 414, such as Mac OS, MS Windows, Unix, or Linux; network applications 416; and an infrastructure management application 418. The operating system 414 may be multi-user, multiprocessing, multitasking, multithreading, real-time and the like. The operating system 414 may also perform basic tasks such as recognizing input from input devices, such as a keyboard or a keypad; sending output to the display 404; keeping track of files and directories on the computer readable medium 410; controlling peripheral devices, such as disk drives, printers, image capture device; and managing traffic on the bus 412. The network applications 416 include various components for establishing and maintaining network connections, such as machine readable instructions for implementing communication protocols including TCP/IP, HTTP, Ethernet, USB, and FireWire.

The infrastructure management application 418 provides various components for managing an infrastructure, as described above. In certain examples, some or all of the processes performed by the application 418 may be integrated into the operating system 414. In certain examples, the processes may be at least partially implemented in digital electronic circuitry, or in computer hardware, machine readable instructions (including firmware and/or software), or in any combination thereof.

What has been described and illustrated herein is an example of the present disclosure along with some of its variations. The terms, descriptions and figures used herein are set forth by way of illustration only and are not meant as limitations. Many variations are possible within the scope of the present disclosure, which is intended to be defined by the following claims—and their equivalents—in which all terms are meant in their broadest reasonable sense unless otherwise indicated.

What is claimed is:

1. A method for managing an infrastructure housing a plurality of first disaggregated heat sources and a plurality of second disaggregated heat sources, wherein each of the plurality of first disaggregated heat sources has a different heat dissipation characteristic as compared with each of the plurality of second disaggregated heat sources, and wherein each of the plurality of first and second disaggregated heat sources comprises an electronic component that performs a particular function and is outside of a casing, the method comprising:

determining cooling requirements for each of the plurality of first and second disaggregated heat sources, wherein the plurality of first disaggregated heat sources are positioned in a first homogeneous zone and the plurality of second disaggregated heat sources are positioned in a second homogeneous zone of the infrastructure, wherein the first homogeneous zone is physically and thermally separate from the second homogeneous zone; and associating, by a processor, a first cooling resource with the first homogeneous zone and a second cooling resource with the second homogeneous zone based upon the determined cooling requirements of the plurality of first and second disaggregated heat sources.

2. The method according to claim 1, said method further comprising:

determining cooling capacities of the first and second cooling resources, and wherein associating further comprises associating the first cooling resource to the first homogeneous zone and the second cooling resource to the second homogeneous zone based upon the determined cooling capacities of the first and second cooling resources and the cooling requirements of the plurality of first and second disaggregated heat sources.

3. The method according to claim 1, wherein each of the plurality of first disaggregated heat sources has the same heat dissipation characteristic with respect to each of the other plurality of first disaggregated heat sources and wherein each of the plurality of second disaggregated heat sources has the same heat dissipation characteristic with respect to the other plurality of second disaggregated heat sources.

4. The method according to claim 1, wherein associating further comprises associating the first and second cooling resources with the first and second homogeneous zones to satisfy a predetermined objective.

5. The method according to claim 4, wherein the predetermined objective comprises at least one of minimizing energy consumed by the plurality of first and second disaggregated heat sources in performing workloads, minimizing energy consumed by the first and second cooling resources in cooling the plurality of first and second disaggregated heat sources, maximizing performance by the plurality of first and second disaggregated heat sources in performing the workloads, maximizing performance by the first and second cooling resources in cooling the plurality of first and second disaggregated heat sources, minimizing an environmental impact of the infrastructure, minimizing a cost of constructing the infrastructure to house the plurality of first and second disaggregated heat sources in the homogeneous zones, and minimizing a cost of implementing the first and second cooling resources to cool the plurality of first and second disaggregated heat sources.

6. The method according to claim 1, further comprising:

managing the infrastructure by, in response to a determination that a capacity constraint of a cooling resource has been violated, associating multiple cooling resources to a functional zone in the infrastructure and postponing performance of workloads to be performed by the plurality of first and second disaggregated heat sources that are outside of the functional zone.

7. The method according to claim 1, further comprising:

managing the infrastructure by scaling workloads across the plurality of first and second disaggregated heat sources in multiple homogeneous zones to substantially prevent heat dissipation by the plurality of first and second disaggregated heat sources from exceeding available cooling capacities of the respective first and second cooling resources.

8. The method according to claim 1, further comprising:

managing the infrastructure by implementing an agent-based trading operation among at least one of the plurality of first and second disaggregated heat sources and the first and second cooling resources in a plurality of homogeneous zones.

9. The method according to claim 1, further comprising:

managing the infrastructure by controlling operation of a first disaggregated heat source of the plurality of first disaggregated heat sources in the homogeneous zone to cause the first disaggregated heat source to dissipate heat at substantially equivalent levels to other first disaggregated heat sources in the first homogeneous zone.

10. The method according to claim 1, wherein the plurality of first disaggregated heat sources are positioned on a first backbone and the plurality of second disaggregated heat sources are positioned on a second backbone, wherein the first backbone is separate from the second backbone.

11. An apparatus for managing an infrastructure housing a plurality of first disaggregated heat sources and a plurality of second disaggregated heat sources, wherein each of the plurality of first disaggregated heat sources has a different heat dissipation characteristic as compared with each of the plurality of second disaggregated heat sources, and wherein each of the plurality of first and second disaggregated heat sources comprises an electronic component that performs a particular function and is outside of a casing, the apparatus comprising:

a processor;

a memory on which is stored machine readable instructions that when executed by the processor cause the processor to:

determine cooling requirements for each of the plurality of first and second disaggregated heat sources, wherein the plurality of first disaggregated heat sources are positioned in a first homogeneous zone and the plurality of second disaggregated heat sources are positioned in a second homogeneous zone of the infrastructure, wherein the first homogeneous zone is physically and thermally separate from the second homogeneous zone; and associate a first cooling resource with the first homogeneous zone and a second cooling resource with the second homogeneous zone based upon the determined cooling requirements of the plurality of first and second disaggregated heat sources.

12. The apparatus according to claim 11, wherein the machine readable instructions are further to cause the processor to determine cooling capacities of the first and second cooling resources and to associate the plurality of first and second disaggregated heat sources with the first and second cooling resources based upon the determined cooling capacities of the first and second cooling resources and the cooling requirements of the plurality of first and second disaggregated heat sources.

13. The apparatus according to claim 11, wherein each of the plurality of first disaggregated heat sources has the same heat dissipation characteristic with respect to the other plurality of first aggregated heat sources and wherein each of the plurality of second disaggregated heat sources has the same heat dissipation characteristic with respect to the other plurality of second aggregated heat sources.

14. The apparatus according to claim 11, wherein the machine readable instructions are further to cause the processor to associate the first and second cooling resources with the first and second homogeneous zones to satisfy a predetermined objective, wherein the predetermined objective comprises at least one of minimizing energy consumed by the plurality of first and second disaggregated heat sources in performing workloads, minimizing energy consumed by the first and second cooling resources in cooling the plurality of first and second disaggregated heat sources, maximizing performance by the plurality of first and second disaggregated heat sources in performing the workloads, maximizing performance by the first and second cooling resources in cooling the plurality of first and second disaggregated heat sources, minimizing an environmental impact of the infrastructure, minimizing a cost of constructing the infrastructure to house the plurality of first and second disaggregated heat sources in the first and second homogeneous zones, and minimizing a cost of implementing the first and second cooling resources to cool the plurality of first and second disaggregated heat sources.

15. The apparatus according to claim 11, wherein the machine readable instructions are further to cause the processor to manage the infrastructure by, in response to a determination that a capacity constraint of a cooling resource has been violated, associating multiple cooling resources with a functional zone in the infrastructure and postponing performance of workloads to be performed by the plurality of first and second disaggregated heat sources that are outside of the functional zone.

16. The apparatus according to claim 11, wherein the machine readable instructions are further to cause the processor to manage the infrastructure by scaling workloads across the plurality of first and second disaggregated heat sources in multiple homogeneous zones to substantially prevent heat dissipation by the plurality of first and second disaggregated heat sources from exceeding available cooling capacities of the respective first and second cooling resources.

17. The apparatus according to claim 11, wherein the machine readable instructions are further to cause the processor to manage the infrastructure by implementing an agent-based trading operation among at least one of the plurality of first and second disaggregated heat sources and the first and second cooling resources in the first and second homogeneous zones.

18. The apparatus according to claim 11, wherein the machine readable instructions are further to cause the processor to manage the infrastructure by controlling operation of a first disaggregated heat source in a homogeneous zone to cause the first disaggregated heat source to dissipate heat at substantially equivalent levels to other first disaggregated heat sources in the first homogeneous zone.

19. An infrastructure comprising:
a first homogeneous zone housing a first set of disaggregated heat sources having a similar heat dissipation characteristic with respect to each other;
a second homogeneous zone housing a second set of disaggregated heat sources having a similar heat dissipation characteristic with respect to each other, wherein the first set of disaggregated heat sources has different heat dissipation characteristics as compared with the second set of disaggregated heat sources, and wherein each of the disaggregated heat sources in the first set and the second set comprises an electronic component that performs a particular function and is outside of a casing;
a first cooling resource positioned to cool the first set of disaggregated heat sources; and
a second cooling resource positioned to cool the second set of disaggregated heat sources, wherein the first cooling resource and the second cooling resource have different cooling capacities with respect to each other.

20. A non-transitory computer readable storage medium on which is embedded a computer program, said computer program implementing a method for managing an infrastructure that houses a plurality of first disaggregated heat sources and a plurality of second disaggregated heat sources, wherein each of the plurality of first disaggregated heat sources has a different heat dissipation characteristic as compared with each of the plurality of second disaggregated heat sources, and wherein each of the plurality of first and second disaggregated heat sources comprises an electronic component that performs a particular function and is outside of a casing, said computer program comprising computer readable code to:
determine cooling requirements for each of the plurality of first and second disaggregated heat sources, wherein the plurality of first disaggregated heat sources are positioned in a first homogeneous zone and the plurality of second disaggregated heat sources are positioned in a second homogeneous zone of the infrastructure, wherein the first homogeneous zone is physically and thermally separate from the second homogeneous zone; and
associate a first cooling resource with the first homogeneous zone and a second cooling resource with the second homogeneous zone based upon the determined cooling requirements of the plurality of first and second disaggregated heat sources to satisfy a predetermined objective.

* * * * *